US012126251B2

(12) United States Patent
Zhou et al.

(10) Patent No.: US 12,126,251 B2
(45) Date of Patent: Oct. 22, 2024

(54) TRANSISTOR TURN-OFF CIRCUIT

(71) Applicant: Navitas Semiconductor Limited, Dublin (IE)

(72) Inventors: Songming Zhou, Shanghai (CN); Tao Liu, San Marino, CA (US); Ruixia Fei, Shanghai (CN); Victor Sinow, Fresno, CA (US)

(73) Assignee: Navitas Semiconductor Limited, Dublin (IE)

( * ) Notice: Subject to any disclaimer, the term of this patent is extended or adjusted under 35 U.S.C. 154(b) by 303 days.

(21) Appl. No.: 17/853,743

(22) Filed: Jun. 29, 2022

(65) Prior Publication Data

US 2023/0006538 A1    Jan. 5, 2023

(51) Int. Cl.

| | |
|---|---|
| *H02M 1/08* | (2006.01) |
| *H02M 1/44* | (2007.01) |
| *H02M 3/335* | (2006.01) |
| *H03K 17/06* | (2006.01) |
| *H03K 17/687* | (2006.01) |

(52) U.S. Cl.
CPC .............. *H02M 1/08* (2013.01); *H02M 1/44* (2013.01); *H02M 3/33507* (2013.01); *H03K 17/06* (2013.01); *H03K 17/687* (2013.01)

(58) Field of Classification Search
CPC ...... H02M 1/08; H02M 1/44; H02M 3/33507; H02M 3/335; H03K 17/06; H03K 17/687
See application file for complete search history.

(56) References Cited

U.S. PATENT DOCUMENTS

| | | |
|---|---|---|
| 4,504,779 A | 3/1985 | Haman |
| 6,271,708 B1 | 8/2001 | Hoshi et al. |
| 7,411,409 B2 | 8/2008 | Klass et al. |
| (Continued) | | |

FOREIGN PATENT DOCUMENTS

| | | |
|---|---|---|
| CN | 205232018 U | 5/2016 |
| CN | 110855134 A | 2/2020 |
| (Continued) | | |

OTHER PUBLICATIONS

U.S. Appl. No. 17/853,740, "Ex Parte Quayle Action", Jul. 28, 2023, 4 pages.

(Continued)

*Primary Examiner* — Adolf D Berhane
(74) *Attorney, Agent, or Firm* — Fisher Broyles, LLP

(57) ABSTRACT

Turn-off circuits. In one aspect, the turn-off circuit includes a transistor having a gate terminal, a source terminal and a drain terminal, a first pull-down circuit connected to the gate terminal, a second pull-down circuit connected to the gate terminal, and a third pull-down circuit connected to the gate terminal. In another aspect, the first, the second and the third pull-down circuits are arranged to cause a turn off of the transistor by changing a voltage at the gate terminal at a first rate of voltage with respect to time from an on-state voltage to a first intermediate voltage, and from the first intermediate voltage to a second intermediate voltage at a second rate of voltage with respect to time, and from the second intermediate voltage to an off-state voltage at a third rate of voltage with respect to time, wherein the first rate is higher than the second rate.

20 Claims, 5 Drawing Sheets

(56) References Cited

U.S. PATENT DOCUMENTS

| | | | |
|---|---|---|---|
| 9,024,558 | B2 | 5/2015 | Sugie |
| 9,300,285 | B2 | 3/2016 | Pang |
| 9,316,681 | B2 | 4/2016 | Sicard |
| 9,368,958 | B2 | 6/2016 | Ferrara et al. |
| 9,543,928 | B2 | 1/2017 | Yamashiro et al. |
| 9,543,942 | B2 | 1/2017 | Sicard et al. |
| 9,584,046 | B2 | 2/2017 | Sicard |
| 9,588,170 | B2 | 3/2017 | Sicard |
| 9,601,985 | B2 | 3/2017 | Kandah et al. |
| 9,608,623 | B1 | 3/2017 | Kandah et al. |
| 9,720,030 | B2 | 8/2017 | Sicard |
| 9,812,941 | B2 | 11/2017 | Sicard et al. |
| 10,516,392 | B2 | 12/2019 | Sicard |
| 10,756,728 | B2 | 8/2020 | Mori et al. |
| 10,848,145 | B2 | 11/2020 | Ishii et al. |
| 10,979,032 | B1 | 4/2021 | Leong et al. |
| 11,073,857 | B1 | 7/2021 | Liberti et al. |
| 11,211,927 | B2 | 12/2021 | Sugie |
| 11,424,741 | B2 | 8/2022 | Liberti et al. |
| 11,569,726 | B2 | 1/2023 | Keskar |
| 11,855,635 | B2 * | 12/2023 | Jia .......................... H03K 3/012 |
| 11,923,832 | B1 * | 3/2024 | Xu ....................... H03K 17/063 |
| 2010/0213990 | A1 | 8/2010 | Yang et al. |
| 2018/0026629 | A1 * | 1/2018 | Ptacek ................ H03K 17/687 |
| | | | 327/109 |
| 2020/0204174 | A1 * | 6/2020 | Mori ............... H03K 17/04206 |
| 2023/0006538 | A1 | 1/2023 | Zhou et al. |

FOREIGN PATENT DOCUMENTS

| | | |
|---|---|---|
| CN | 111106822 A | 5/2020 |
| CN | 111865054 A | 10/2020 |
| JP | 3997905 B2 | 10/2007 |
| TW | I508096 B | 11/2015 |

OTHER PUBLICATIONS

U.S. Appl. No. 17/853,740, "Non-Final Office Action", Apr. 17, 2023, 10 pages.

TW111124268, "Office Action", Apr. 21, 2023, 7 pages.

\* cited by examiner

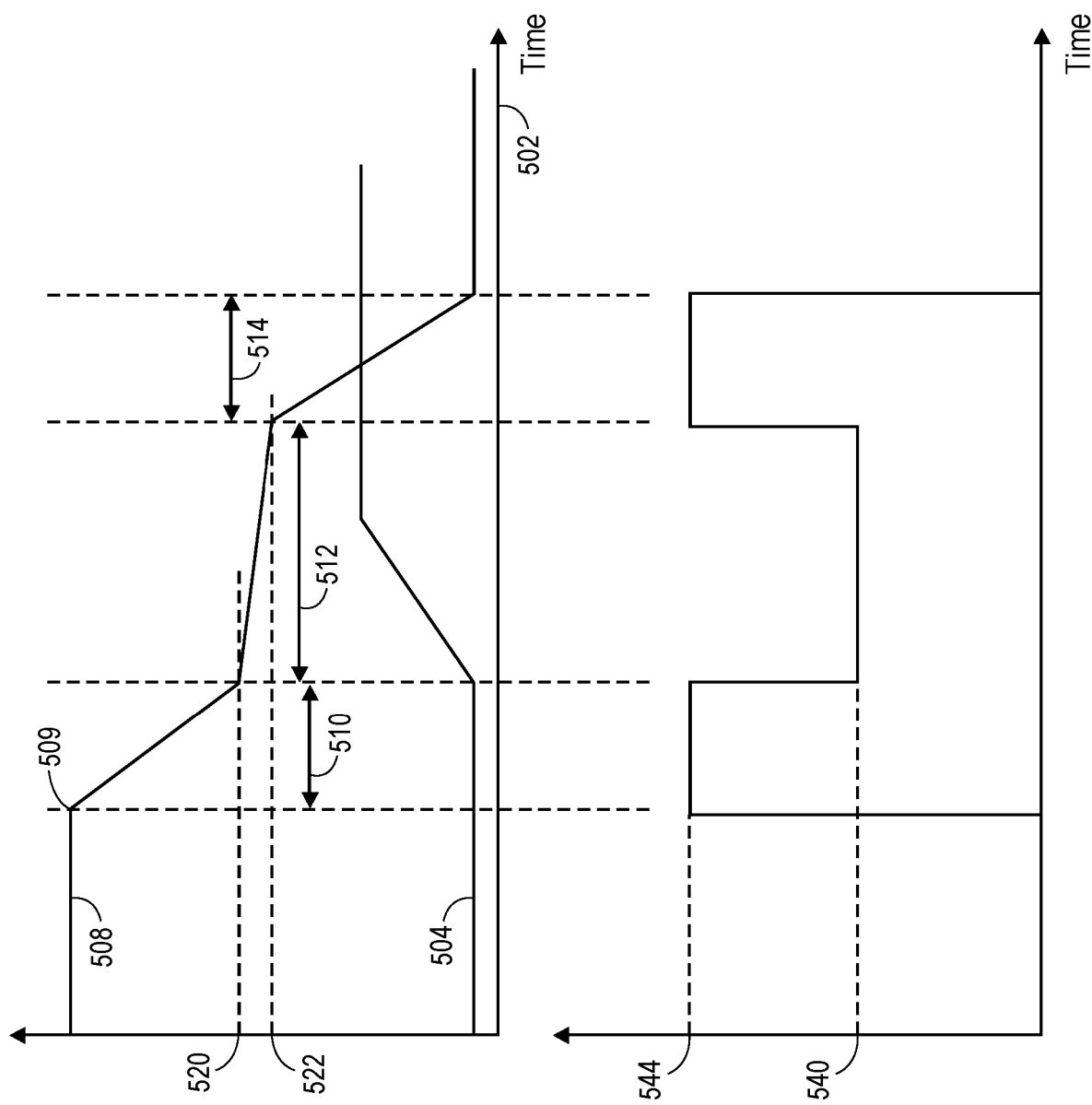

TRANSISTOR TURN-OFF CIRCUIT

CROSS-REFERENCE TO RELATED APPLICATIONS

The present application claims the benefit of China Patent Application No. 202110732707.1 filed on Jun. 30, 2021, entitled "TRANSISTOR TURN-OFF CIRCUIT", the entire contents of which is incorporated herein by reference for all purposes.

FIELD

The described embodiments relate generally to power converters, and more particularly, the present embodiments relate to turn-off circuits for power converters employing gallium nitride (GaN) transistors.

BACKGROUND

Electronic devices such as computers, servers and televisions, among others, employ one or more electrical power conversion circuits to convert one form of electrical energy to another. Some electrical power conversion circuits convert a high DC voltage to a lower DC voltage using a circuit topology called a half bridge converter. As many electronic devices are sensitive to size and efficiency of the power conversion circuit, new power converters can provide relatively higher efficiency and lower size for the new electronic devices.

SUMMARY

In some embodiments, a circuit is disclosed. The circuit includes circuit includes a transistor having a gate terminal, a source terminal and a drain terminal, a first pull-down circuit connected to the gate terminal, a second pull-down circuit connected to the gate terminal, and a third pull-down circuit connected to the gate terminal, where the first, the second and the third pull-down circuits are arranged to cause a turn off of the transistor by changing a voltage at the gate terminal at a first rate of voltage with respect to time from an on-state voltage to a first intermediate voltage, and from the first intermediate voltage to a second intermediate voltage at a second rate of voltage with respect to time, and from the second intermediate voltage to an off-state voltage at a third rate of voltage with respect to time, where the first rate is higher than the second rate.

In some embodiments, the third rate is higher than the second rate.

In some embodiments, the transistor includes gallium nitride (GaN).

In some embodiments, the off-state voltage of the transistor prevents current from flowing through the transistor.

In some embodiments, the first pull-down circuit includes a first pull-down transistor.

In some embodiments, the second pull-down circuit includes a second pull-down transistor.

In some embodiments, the second pull-down circuit further includes a diode-connected transistor.

In some embodiments, the third pull-down circuit includes a third pull-down transistor and a logic circuit.

In some embodiments, the logic circuit is coupled to a gate terminal of the third pull-down transistor, where the logic circuit is arranged to control an operation of the third pull-down transistor.

In some embodiments, a method of turning off a power transistor is disclosed. The method includes providing a power transistor with a gate terminal, a source terminal and a drain terminal, the gate terminal arranged to control operation of the power transistor, providing a turn-off circuit, the turn-off circuit coupled to the gate terminal, receiving, by the turn-off circuit, a turn-off signal, where in response to receiving the turn-off signal the turn-off circuit controls a voltage at the gate terminal such that the voltage at the gate terminal changes at a first rate of voltage with respect to time from a first voltage to a first intermediate voltage, and at a second rate of voltage with respect to time from the first intermediate voltage to a second intermediate voltage, and at a third rate of voltage with respect to time from the second intermediate voltage to second voltage, where the first rate is higher than the second rate and the third rate is higher than the second rate.

In some embodiments of the disclosed method, the first voltage is an on-state voltage of the power transistor that enables current to flow through the power transistor and the second voltage is an off-state voltage of the power transistor that prevents current from flowing through the power transistor.

In some embodiments of the disclosed method, the turn-off circuit includes a first pull-down circuit, a second pull-down circuit, and a third pull-down circuit.

In some embodiments of the disclosed method, the first pull-down circuit, the second pull-down circuit and the third pull-down circuit are coupled to the gate terminal.

In some embodiments of the disclosed method, the first pull-down circuit includes a first pull-down transistor.

In some embodiments of the disclosed method, the second pull-down circuit includes a second pull-down transistor.

In some embodiments of the disclosed method, the second pull-down circuit further includes a diode-connected transistor.

In some embodiments, a power converter circuit is disclosed. The power converter circuit includes a power transistor with a gate terminal, a drain terminal and source terminal, the gate terminal arranged to control operation of the power transistor, and the drain terminal coupled to a first node of a primary side of a transformer, a control circuit coupled to a second node of the primary side of the transformer, and a turn-off circuit coupled to the gate terminal and arranged to change a voltage at the gate terminal at a first rate of voltage with respect to time from a first voltage to a first intermediate voltage, and to change the voltage at the gate terminal at a second rate of voltage with respect to time from the first intermediate voltage to a second intermediate voltage, and to change the voltage at the gate terminal at a third rate of voltage with respect to time from the second intermediate voltage to a second voltage, the first rate being higher than the second rate.

In some embodiments, the first voltage is an on-state voltage of the power transistor that enables current to flow through the power transistor and the second voltage is an off-state voltage of the power transistor that prevents current from flowing through the power transistor.

In some embodiments, the third rate is higher than the second rate.

In some embodiments, the turn-off circuit includes a first pull-down circuit, a second pull-down circuit and a third pull down circuit.

BRIEF DESCRIPTION OF THE DRAWINGS

FIG. 5A shows gate voltage and drain voltage as a function of time for the GaN power transistor shown in FIG. 1 according to embodiments of the disclosure; and FIG. 5B illustrates a timing diagram showing gate to source current flow for the GaN power transistor shown in FIG. 1 according to embodiments of the disclosure.

DETAILED DESCRIPTION

Circuits and related techniques disclosed herein relate generally to power conversion circuits that employ one or more gallium nitride (GaN) devices. More specifically, circuits, devices and related techniques disclosed herein relate to power converter circuits employing GaN power switches where turn-off circuits can be utilized to control and to optimize the turn-off of the GaN power switch, resulting in improved electromagnetic interference (EMI) performance of the power converter. In some embodiments, the turn-off circuits can control excessive ringing that may exist when an external silicon controller gate driver is used to drive a GaN power switch. In various embodiments, the turn-off circuits can reduce a relatively high rate of change of the voltage with respect to time (dV/dt) at a drain terminal of the GaN power switch and prevent the GaN power switch from turning on when it is to stay in the off-state. Various inventive embodiments are described herein, including methods, processes, systems, devices, and the like.

Several illustrative embodiments will now be described with respect to the accompanying drawings, which form a part hereof. The ensuing description provides embodiment (s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Figure 1:
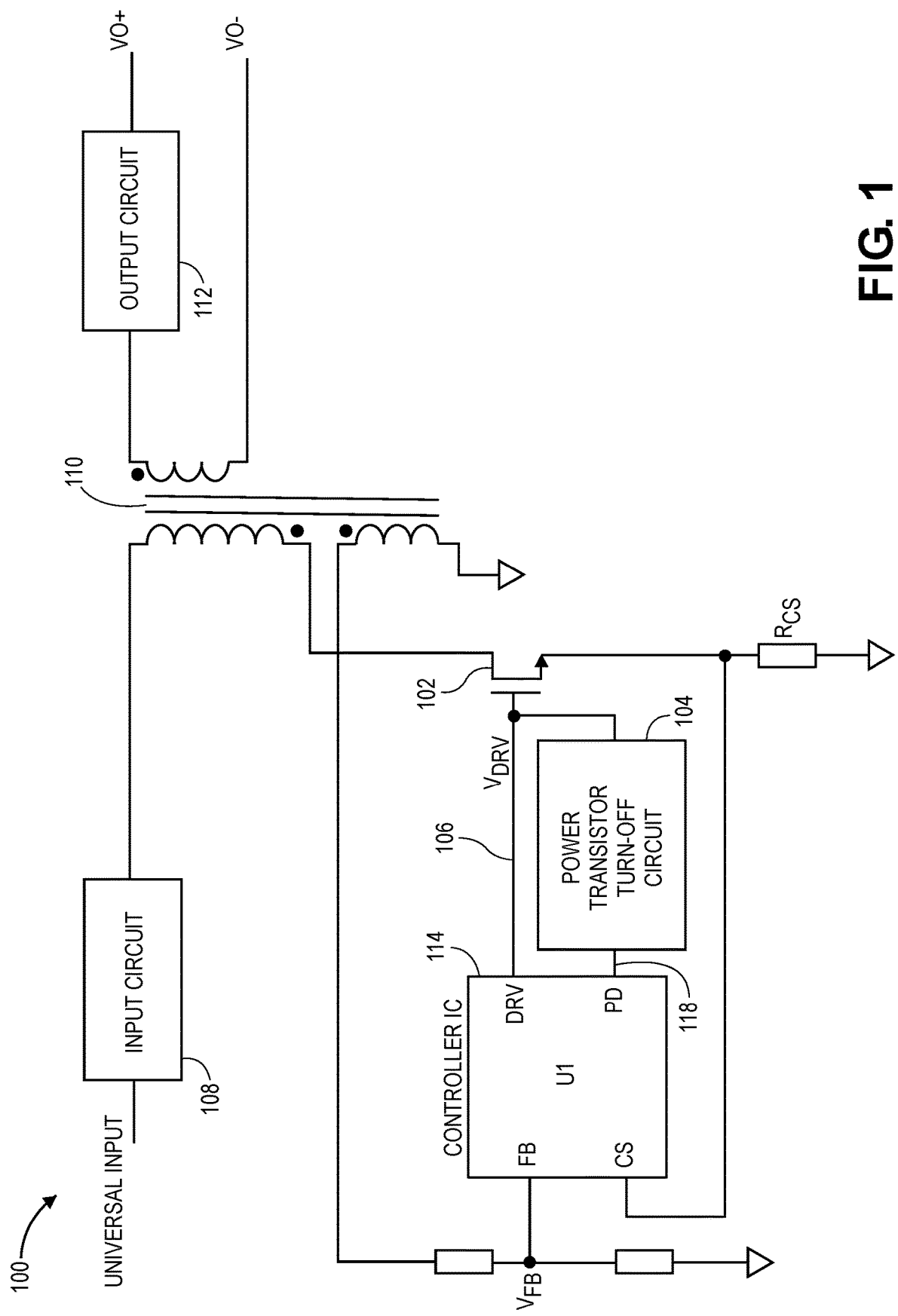
FIG. 1 is a simplified schematic of a power converter with a turn-off circuit according to an embodiment of the disclosure.

FIG. 1 depicts an illustrative rendering of a power converter circuit, such as an AC-DC flyback power converter circuit 100 according to some embodiments of the disclosure. As shown in FIG. 1, the AC-DC flyback power converter circuit 100 can include a GaN power transistor 102. The AC-DC converter can further include an input circuit 108, a transformer 110 and an output circuit 112. The input circuit 108 can condition a universal input voltage and feed it into the primary side of the transformer 110. The converter circuit 100 can also include a controller IC 114 to drive the GaN power transistor 102. The controller IC 114 can provide a gate drive voltage to the gate 106 of the GaN power transistor 102. In some embodiments, a turn-off circuit 104 can control the turn-off behavior of the GaN power transistor 102. The turn-off circuit 104 can be employed to reduce excessive ringing in the drain-to-source current of the GaN power transistor 102 when the GaN transistor 102 turns off, resulting in improved EMI performance of the power converter circuit 100. GaN power transistors can turn off much faster than their silicon counterparts, thus without proper control of the GaN power transistor, the fast turn-off of the GaN power transistor can cause excessive ringing due to parasitic inductances which are inherent in circuit boards. Controller IC 114 can provide a pull-down (PD) signal 119 at terminal 118 to the turn-off circuit 104, which can be used by the turn-off circuit 104 to control the gate voltage of the GaN power transistor 102. In various embodiments, the turn-off circuit 104 can be formed in the same die as the GaN power transistor 102, while in other embodiments the turn-off circuit can be formed as part of the same die as the controller IC 114. In some embodiments, controller IC 114 can be formed in a silicon substrate.

In order to better appreciate the features and aspects of turn-off circuits according to the present disclosure, further context for the disclosure is provided in the following section by discussing one particular implementation of turn-off circuits according to embodiments of the present disclosure. These embodiments are for example only and other embodiments can be employed in other power converter circuits such as, but not limited to DC-DC power converters employing GaN power devices.

Figure 2:
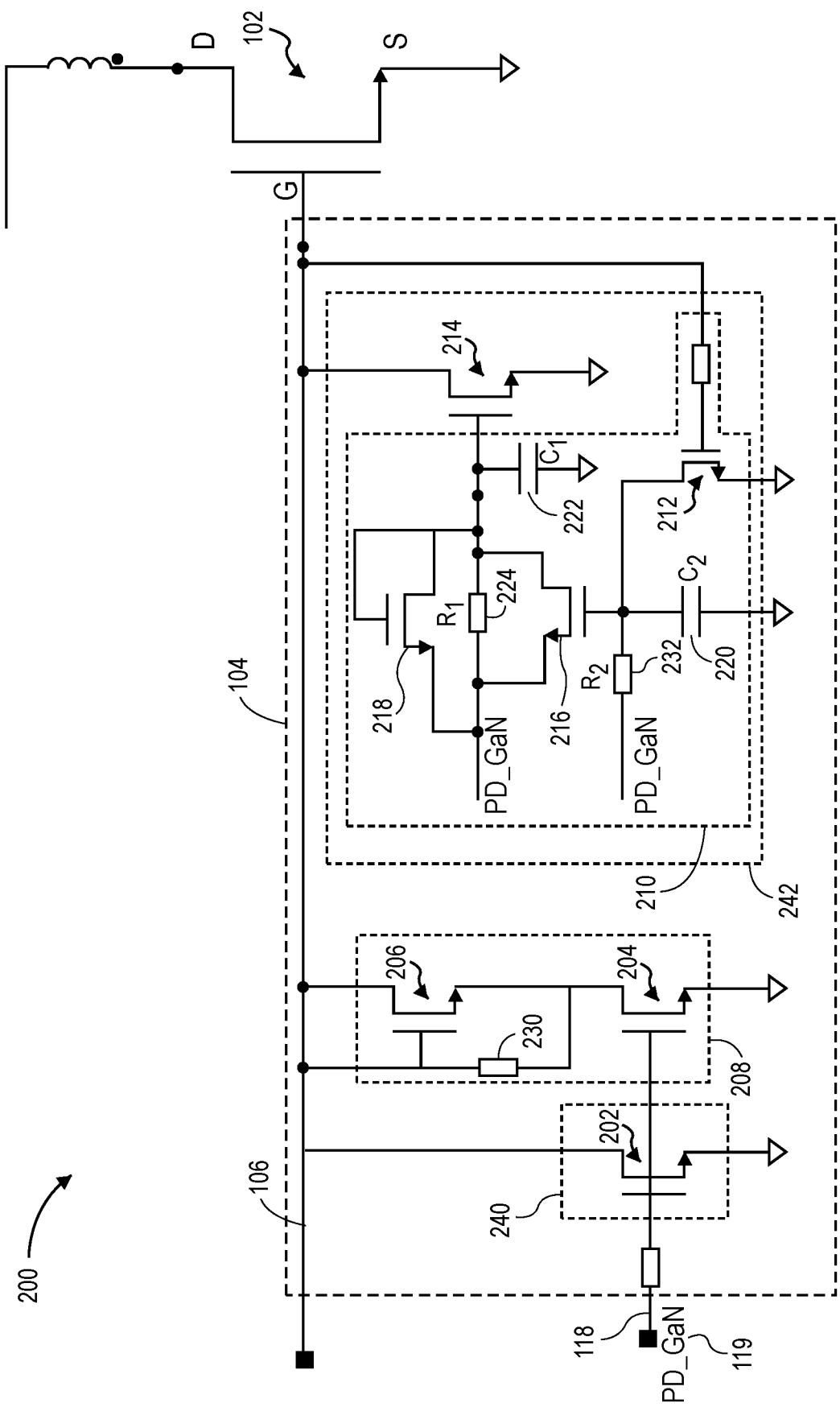
FIG. 2 is a schematic of the turn-off circuit shown in FIG. 1 according to an embodiment of the disclosure.

Now referring to FIG. 2, a more detailed view of turn-off circuit 104 of power converter circuit 100 is illustrated. The turn-off circuit 104 can include three segments: a first segment 240 which includes transistor 202 that can be connected between the gate 106 of the GaN power transistor 102 and ground; a second segment 208 which includes a transistor 204 and a diode-connected transistor 206, where transistors 204 and 206 can be arranged in a cascode configuration; and a third segment 242 which can include a pull down transistor 214 and its gate drive circuit 210. The three segment configuration of the turn-off circuit can mitigate EMI emissions during the turn-off of the GaN power transistor 102 without sacrificing performance or adding significant die size. In some embodiments, when pull down signal 119 (PD_GaN) goes high, first segment transistor 202 can turn on and can provide a constant discharge of the gate 106 of the GaN power transistor 102. The second segment transistor 204 can also turn-on when PD_GaN signal goes high. Transistor 204 can be used for fast discharging of the gate voltage of the GaN power transistor 102. Resistor 230 can be used to set the bias point for the operation of transistor 206. During turn-off of the GaN power transistor 102, the voltage on its gate 106 can be pulled down by the second stage to within one threshold voltage above ground. The third segment transistor 214 can also turn-on when PD_GaN goes high, however due to the presence of the resistor 224 ($R_1$) and capacitor 222 ($C_1$) the turn-on of the transistor 214 can be delayed by a time constant $R_1C_1$. As an example, the $R_1C_1$ delay can be 10 to 20 ns. As appreciated by one of ordinary skill in the art having the benefit of this disclosure the value of the delay can be set to any suitable value. A diagram of the voltage of gate 106 during turn-off is described further below in FIG. 3.

The size of the transistor 214 can be designed such that when the gate 106 of the GaN power transistor 102 is pulled down, the gate 106 is prevented from going high again due to presence of high rate of change of voltage as a function of time (dv/dt) at the drain of the GaN power transistor 102, i.e., the drain the of the GaN power transistor 102 can rise rapidly and have an overshoot. The gate-to-drain capacitance of the GaN power transistor 102 can couple the drain voltage (which is overshooting to the high side) onto its gate voltage, and cause the gate voltage to go high (from a low state) and cause the GaN power transistor to turn back on. Thus, transistor 214 is designed such that it can overcome the gate-to-drain capacitance of the GaN power transistor 102, for example, the size of the transistor 214 can be designed to be 7% to 10% the size of the GaN power transistor 102. Proper sizing of transistor 214 can enable transistor 214 to hold the gate of the GaN power transistor 102 in low-state during turn-off. As appreciated by one of ordinary skill in the art having the benefit of this disclosure the any suitable ratio of sizes of the GaN power transistor 102 and transistor 214 can be used.

The $R_1C_1$ network (resistor 224 and capacitor 222) connected at the gate of transistor 214 can add a delay to the turn-off of transistor 214, which may cause shoot-through when the gate 106 of the GaN power transistor is turning on. To address this shoot-through, a diode connected transistor 218 and a transistor 216 can be connected in parallel with the resistor 224 ($R_1$). Transistors 218 and 216 can be utilized to discharge the gate of transistor 214 rapidly such that transistor 214 can be turned off rapidly so as to prevent shoot-through. The gate of the transistor 216 can be controlled by the signal PD_GaN with a delay added by the resistors 232 ($R_2$) and capacitor 220 ($C_2$). In this way, the $R_2C_2$ time delay can cause the voltage at the gate of transistor 216 to be held at the value of PD_GaN signal. As an example, the value of $R_2C_2$ delay can be 20 to 30 ns. As appreciated by one of ordinary skill in the art having the benefit of this disclosure the value of the delay can be set to any suitable value.

Figure 3:
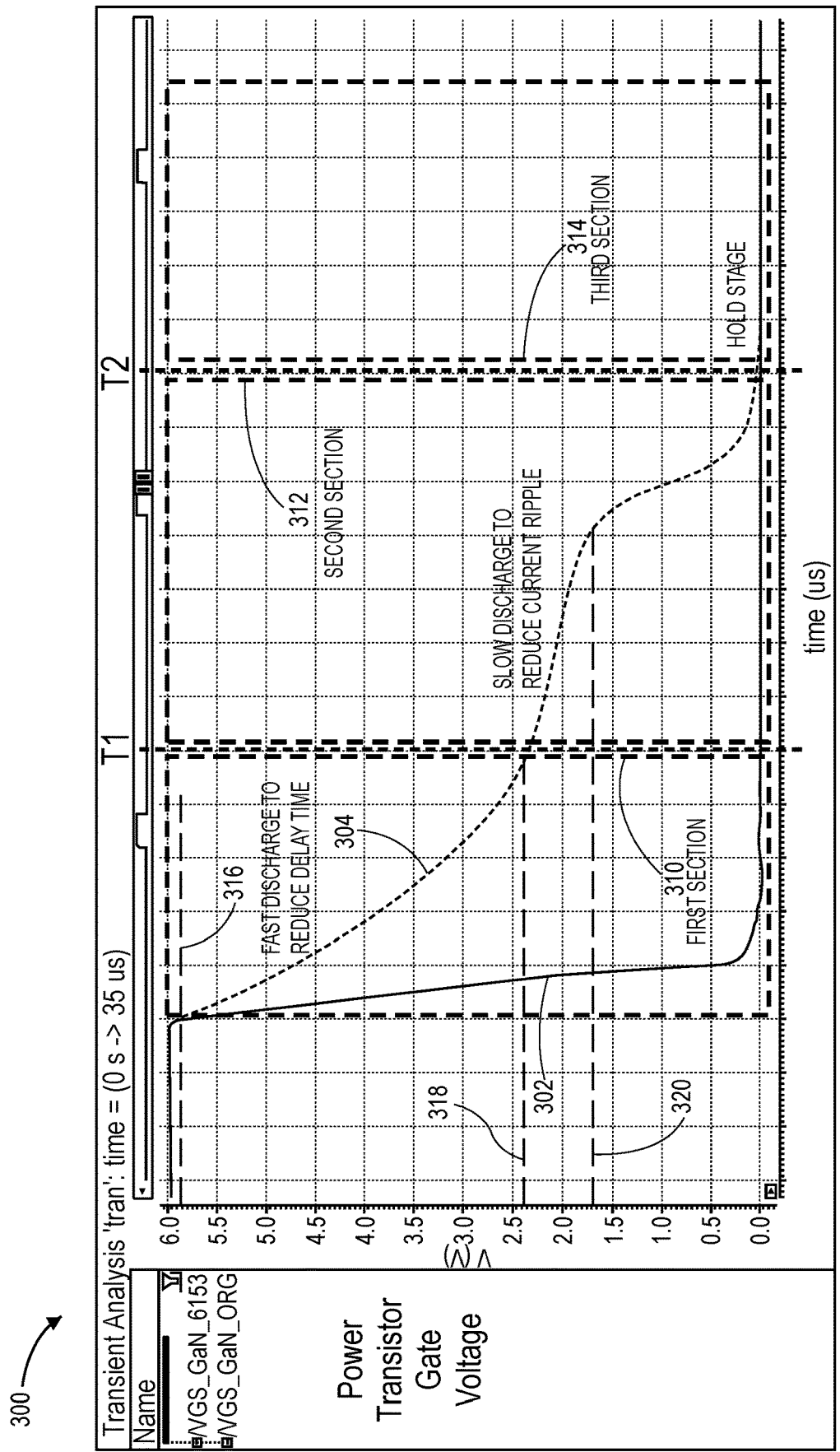
FIG. 3 shows a diagram of gate voltage of a GaN power transistor shown in FIG. 1 as a function of time.

Now referring to FIG. 3, an example diagram 300 of the gate voltage of the GaN power transistor 102 as a function of time is shown. More specifically, graph 304 shows the gate voltage of the GaN power transistor 102 with the turn-off circuit connected to it gate, while graph 302 shows the gate of the GaN power transistor 102 with a single pull down transistor but without the turn-off circuit. In diagram 300, the gate voltage drops from 6 V to 0 V to turn off transistor 102. As can be seen in graph 302, without the turn-off circuit, the gate of the GaN power transistor drops rapidly from high-state to low-state. This can cause ringing of its drain-to-source current and cause EMI emission.

Graph 304 shows that three distinct sections exist when the turn-off circuit 104 is connected to the gate 106 of the GaN power transistor. During the first section 310, the gate voltage drops rapidly from the on-state voltage 316 to a first intermediate voltage 318. This is caused by the turn-on of the transistor 204. This rapid drop minimizes delay time. During the second section 312, the gate voltage drops from the first intermediate voltage 318 to a second intermediate voltage 320 at a slower rate. This slow down can result in a significant reduction in EMI by keeping the gate voltage between the first and the second intermediate voltages. The slow-down of the rate of drop of the gate voltage in the second section slows down the discharge of the gate, which reduces ripple in the drain-to-source current of the GaN power transistor. Transistor 202 can set the duration of time between T1 to T2, where transistor 202 holds the voltage on gate 106 at a low state. During second section 312, voltage of gate 106 can drop to a value of one threshold voltage of the transistor 206, since the transistor 206 is in diode-connected configuration, for example the voltage of gate 106 can drop from 6 V to around 1.5 V. As appreciated by one of ordinary skill in the art having the benefit of this disclosure the initial gate voltage and the threshold voltage of the transistor 206 can be adjusted to any suitable values. In the third section 314, after T2, the dv/dt event has passed and the gate voltage drops rapidly to a low state and can be held in a low state by the pull-down transistor 214. The pull-down transistor 214 can prevent the gate of the GaN power transistor 102 from going high again, which can occur due to the gate 106 capacitively coupling to the drain of the transistor 102. As described earlier, the third section is dominated by the turn-on of the pull-down transistor 214 because transistor 214 turns on after a time delay due to $R_1C_1$ network. The three stage drop in the gate voltage of the GaN power transistor during turn-off can reduce ringing and improve EMI, while keeping switching power losses low in the power converter 100.

The turn-off circuit can effectively mitigate EMI emissions without increasing die size significantly. For example, the size of the transistors 206 and 204 can be 20% of the size of transistor 214, and the size the transistor 202 can be 20% the size of the transistor 204. As appreciated by one of ordinary skill in the art having the benefit of this disclosure the value of the ratio of transistor sizes can be any suitable size. Thus, the die area of the turn-off circuit can be minimal. Furthermore, the turn-off circuit does not require complicated or extra control signals, thus saving die area. Moreover, the die area consumed by the $R_1C_1$ network can be minimal, for example the delay of $R_1C_1$ network can be 10 to 20 ns, which would use small values for resistor $R_1$ and capacitor $C_1$. As appreciated by one of ordinary skill in the art having the benefit of this disclosure the value of the time delay of $R_1C_1$ network and the values for resistor $R_1$ and capacitor $C_1$ can be any suitable values. As further appreciated by one of ordinary skill in the art, the turn-off circuit can have fewer or a greater number of stages, the rate of turn off, the total time of turn off and other characteristics can be different than described herein.

Figure 4:
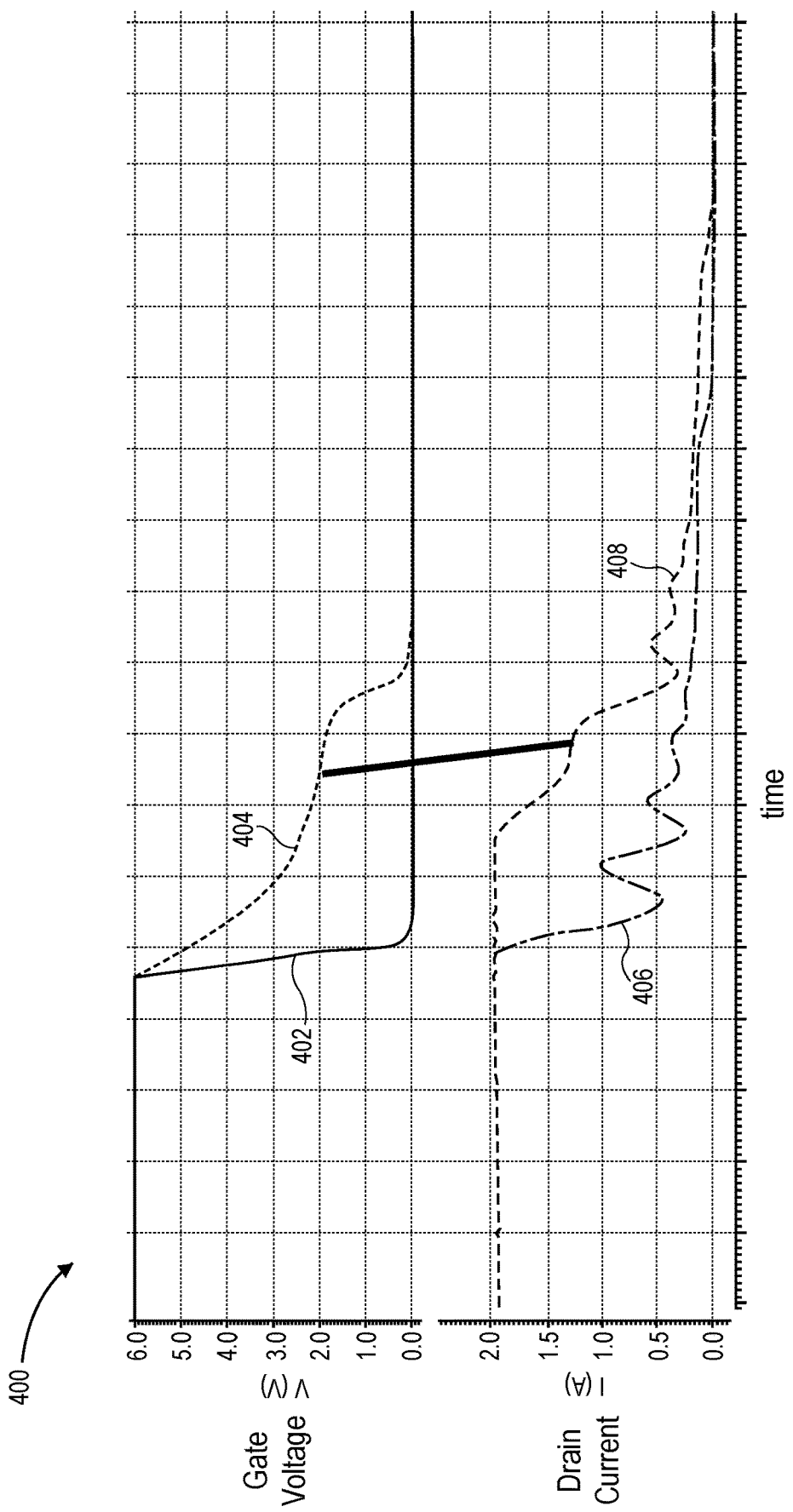
FIG. 4 shows a diagram of gate voltage, drain current and source current of the GaN power transistor shown in FIG. 1 as a function of time.

Now referring to FIG. 4, a graph 400 of gate voltage, drain current of the GaN power transistor 102 as a function of time is shown. In graph 400, the gate voltage drops from 6 V to 0 V. Graph 404 shows the gate voltage of the GaN power transistor 102 with the turn-off circuit connected to its gate 106, while graph 402 shows the gate without the turn-off circuit being connected. As can be seen in graph 402, the gate of the GaN power transistor drops rapidly from high to low. This can cause ringing of its drain current and cause EMI emission. With the turn-off circuit connected to the gate 106, graph 404 shows three distinct segments, as described previously in FIG. 3.

Graph 408 shows the drain current of the GaN power transistor 102 with the turn-off circuit connected to it gate, while graph 406 shows the drain current of the GaN power transistor 102 without the turn-off circuit being connected. As can be seen, the turn-off circuit reduces the ringing in the drain current of the GaN power transistor 102. This in turn can reduce EMI emission in frequency ranges which are to be protected (in the electromagnetic spectrum). With the majority of ringing removed, the remaining ringing in the drain current may cause emissions in frequency ranges which are not of concern.

Now referring to FIG. 5A, gate voltage 508 and drain voltage 504 as a function of time 502 for GaN power transistor 102 are illustrated according to embodiments of the disclosure. Gate voltage 508 shows the voltage at the gate of the GaN power transistor 102 and drain voltage 504 shows the drain-to-source voltage of the GaN power transistor 102. Initially the gate voltage starts at in a high state. Then, the gate voltage of the GaN power transistor 102 drops at a relatively fast rate as shown in region 510. In region 512, the gate voltage reaches the miller plateau. During region 510, the gate voltage drops rapidly from an on-state voltage 509 to a first intermediate voltage 520. This rapid drop minimizes delay time. During region 512, the gate voltage drops from the first intermediate voltage 520 to a second intermediate voltage 522 at a slower rate. This slow down can result in a significant reduction in EMI by keeping the gate voltage between the first and the second intermediate voltages. The slow-down of the rate of drop of the gate voltage in the second section slows down the discharge of the gate, which can reduce ripple in the drain-to-source current of the GaN power transistor 102. Following region 512, the gate voltage of the GaN power transistor 102 may drop again at a relatively fast rate as indicated in region 514. Following region 514, the GaN power transistor 102 can be maintained in an off-state.

FIG. 5B illustrates a timing diagram showing gate to source current flow for the GaN power transistor 102. FIG. 5B shows the gate to source current flow in time periods corresponding to the gate voltage 508 transitions. During region 510, a relatively large gate to source current 544 can flow causing a relatively rapid voltage drop from an on-state voltage 509 to a first intermediate voltage 520. During region 512, the gate to source current may be reduced from a relatively large value of 544 to a relatively small value of 540. In this way, in region 512, the gate voltage may drop at a relatively slow rate with respect to time. During region 514, the gate to source current flow can increase from a relatively small value of 540 to a relatively large value of 544. In this way, in region 514, the gate voltage may drop at a relatively fast rate with respect to time.

Although power converter 100 (see FIG. 1) is described and illustrated as one particular power converter, embodiments of the disclosure are suitable for use with a multiplicity of power converters. For example, any device that converts power can be used with embodiments of the disclosure. In some instances, embodiments of the disclosure are particularly well suited for use with AC-DC, and/or DC-DC power converters.

For simplicity, various internal components, such as the control circuitry, bus, memory, storage device and other components of power converter 100 (see FIG. 1) are not shown in the figures.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. A circuit comprising:
   a transistor having a gate terminal, a source terminal and a drain terminal;
   a first pull-down circuit connected to the gate terminal;
   a second pull-down circuit connected to the gate terminal; and
   a third pull-down circuit connected to the gate terminal;
      wherein the first, the second and the third pull-down circuits are arranged to cause a turn off of the transistor by changing a voltage at the gate terminal at a first rate of voltage with respect to time from an on-state voltage to a first intermediate voltage, and from the first intermediate voltage to a second intermediate voltage at a second rate of voltage with respect to time, and from the second intermediate voltage to an off-state voltage at a third rate of voltage with respect to time, wherein the first rate is higher than the second rate.

2. The circuit of claim 1, wherein the third rate is higher than the second rate.

3. The circuit of claim 1, wherein the transistor comprises gallium nitride (GaN).

4. The circuit of claim 1, wherein the off-state voltage of the transistor prevents current from flowing through the transistor.

5. The circuit of claim 3, wherein the first pull-down circuit comprises a first pull-down transistor.

6. The circuit of claim 5, wherein the second pull-down circuit comprises a second pull-down transistor.

7. The circuit of claim 6, wherein the second pull-down circuit further comprises a diode-connected transistor.

8. The circuit of claim 5, wherein the third pull-down circuit comprises a third pull-down transistor and a logic circuit.

9. The circuit of claim 8, wherein the logic circuit is coupled to a gate terminal of the third pull-down transistor, and wherein the logic circuit is arranged to control an operation of the third pull-down transistor.

10. A method of turning off a power transistor, the method comprising:
providing a power transistor with a gate terminal, a source terminal and a drain terminal, the gate terminal arranged to control operation of the power transistor;
providing a turn-off circuit, the turn-off circuit coupled to the gate terminal; and
receiving, by the turn-off circuit, a turn-off signal, wherein in response to receiving the turn-off signal the turn-off circuit controls a voltage at the gate terminal such that the voltage at the gate terminal changes at a first rate of voltage with respect to time from a first voltage to a first intermediate voltage, and at a second rate of voltage with respect to time from the first intermediate voltage to a second intermediate voltage, and at a third rate of voltage with respect to time from the second intermediate voltage to second voltage, wherein the first rate is higher than the second rate and the third rate is higher than the second rate.

11. The method according to claim 10, wherein the first voltage is an on-state voltage of the power transistor that enables current to flow through the power transistor and the second voltage is an off-state voltage of the power transistor that prevents current from flowing through the power transistor.

12. The method according to claim 10, wherein the turn-off circuit comprises a first pull-down circuit, a second pull-down circuit, and a third pull-down circuit.

13. The method according to claim 12, wherein the first pull-down circuit, the second pull-down circuit and the third pull-down circuit are coupled to the gate terminal.

14. The method according to claim 12, wherein the first pull-down circuit comprises a first pull-down transistor.

15. The method according to claim 14, wherein the second pull-down circuit comprises a second pull-down transistor.

16. The method according to claim 15, wherein the second pull-down circuit further comprises a diode-connected transistor.

17. A power converter circuit comprising:
a power transistor with a gate terminal, a drain terminal and source terminal, the gate terminal arranged to control operation of the power transistor, and the drain terminal coupled to a first node of a primary side of a transformer;
a control circuit coupled to a second node of the primary side of the transformer; and
a turn-off circuit coupled to the gate terminal and arranged to change a voltage at the gate terminal at a first rate of voltage with respect to time from a first voltage to a first intermediate voltage, and to change the voltage at the gate terminal at a second rate of voltage with respect to time from the first intermediate voltage to a second intermediate voltage, and to change the voltage at the gate terminal at a third rate of voltage with respect to time from the second intermediate voltage to a second voltage, the first rate being higher than the second rate.

18. The power converter circuit of claim 17, wherein the first voltage is an on-state voltage of the power transistor that enables current to flow through the power transistor and the second voltage is an off-state voltage of the power transistor that prevents current from flowing through the power transistor.

19. The power converter circuit of claim 18, wherein the third rate is higher than the second rate.

20. The power converter circuit of claim 19, wherein the turn-off circuit comprises a first pull-down circuit, a second pull-down circuit and a third pull down circuit.

* * * * *